United States Patent
Yang

(10) Patent No.: US 7,651,888 B2
(45) Date of Patent: Jan. 26, 2010

(54) WAFER LEVER FIXTURE AND METHOD FOR PACKAGING MICRO-ELECTRO-MECHANICAL-SYSTEM DEVICES

(75) Inventor: Hsueh An Yang, Taipei (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 110 days.

(21) Appl. No.: 12/057,949

(22) Filed: Mar. 28, 2008

(65) Prior Publication Data
US 2009/0215228 A1    Aug. 27, 2009

(30) Foreign Application Priority Data
Jun. 8, 2007    (TW) .............................. 96120677 A

(51) Int. Cl.
| H01L 21/50 | (2006.01) |
| H01L 21/48 | (2006.01) |
| H01L 21/44 | (2006.01) |
| H01L 21/78 | (2006.01) |
| H01L 21/52 | (2006.01) |
| H01L 23/12 | (2006.01) |

(52) U.S. Cl. ....................... 438/110; 438/113; 438/118; 438/107; 438/460; 257/704; 257/E21.499

(58) Field of Classification Search ................. 438/110, 438/113, 118, 107, 460; 257/704, E21.499
See application file for complete search history.

(56) References Cited

U.S. PATENT DOCUMENTS

| 6,768,628 | B2 |   | 7/2004 | Harris et al. |         |
| 7,045,868 | B2 | * | 5/2006 | Ding et al.   | 257/414 |
| 7,226,810 | B2 | * | 6/2007 | Kocian et al. | 438/110 |
| 7,393,758 | B2 | * | 7/2008 | Sridhar et al.| 438/460 |
| 7,576,427 | B2 | * | 8/2009 | Potter        | 257/710 |

\* cited by examiner

*Primary Examiner*—Luan C Thai

(57) ABSTRACT

A fixture for packaging MEMS devices includes a base, a first material layer, an insulating layer and a second material layer. The base defines units, each including a notch. The first material layer is disposed on the base and the notches. The insulating layer is disposed on a part of the first material layer and exposes the other part of the first material layer located on the notches. The second material layer is disposed on the other part of the first material layer and formed with caps, whereby the caps are physically connected to the MEMS devices, and the MEMS devices are corresponding to the units of the base, wherein there is a first connecting force between the first and second material layers, there is a second connecting force between the caps and the MEMS devices, and the second connecting force is greater than the first connecting force.

18 Claims, 7 Drawing Sheets

WAFER LEVER FIXTURE AND METHOD FOR PACKAGING MICRO-ELECTRO-MECHANICAL-SYSTEM DEVICES

CROSS REFERENCE TO RELATED APPLICATION

This application claims the priority benefit of Taiwan Patent Application Serial Number 096120677, filed Jun. 8, 2007, the full disclosure of which is incorporated herein by reference.

BACKGROUND OF THE INVENTION

1. Field of the Invention

The present invention generally relates to fixture and method for packaging MEMS devices, and more particularly to a wafer lever fixture which can be repeatedly used after the MEMS devices are packaged.

2. Description of the Related Art

Micro-electro-mechanical-system (MEMS) components are gradually applied to many electronic circuits and a variety of micro sensor. For example, the MEMS components can be electro-mechanical motors, radio frequency (RF) switches, pressure transducers and accelerometers.

U.S. Pat. No. 6,768,628, entitled "Method for Fabricating an Isolated Microelectromechanical System (MEMS) Device Incorporating a Wafer Level Cap", discloses a structure of MEMS device, which includes a wafer lever cap for packaging a plurality of MEMS elements so as to protect the MEMS elements and to prevent the MEMS elements from the pollution of external dust. The wafer lever cap includes a plurality of caps, which are physically connected to each other. All caps must be mounted on the MEMS device, and then are separated from each other. However, U.S. Pat. No. 6,768,628 fails to disclose the process for separating the caps from each other.

Recently, a conventional method for packaging MEMS devices as follows. Referring to FIG. 1a, a base 10 is provided, wherein the base 10 has notch regions 14 located on the surface 12. Then, a photoresist 20 is formed on the base 10, and the photoresist 20 is patterned for exposing the notch regions 14. Referring to FIG. 1b, the notch regions 14 of the base 10 are etched for forming notches 16. Referring to FIG. 1c, a seed metallic layer 30 is formed on a part of the photoresist 20 located on the surfaces 12 of the base 10 and the notches 16 by a sputtering process. Referring to FIG. 1d, an insulating layer 40 is formed on the seed metallic layer 30, and the insulating layer 40 is patterned for exposing a part of the seed metallic layer 30 located on the notches 16. Referring to FIG. 1e, a metallic layer 50 is electroplated on the part of the seed metallic layer 30 located on the notches 16 so as to form caps 52. Referring to FIG. 1f, the caps 52 are physically connected to MEMS devices 60. Referring to FIG. 1i, when the base 10, the photoresist 20, the other part of the seed metallic layer 30 and the insulating layer 40 are etched, the caps 52 are reserved for packaging the MEMS devices 60.

However, steps of the conventional method for packaging the MEMS devices are complex, and they waste the material cost of the base, the photoresist, the other part of the seed metallic layer and the insulating layer.

Accordingly, there exists a need for fixture and method for packaging MEMS devices capable of solving the above-mentioned problems.

SUMMARY OF THE INVENTION

It is an object of the present invention to provide a wafer lever fixture which can be repeatedly used after the MEMS devices are packaged.

In order to achieve the foregoing object, the present invention provides a fixture for packaging MEMS devices. The fixture includes a base, a first material layer, an insulating layer and a second material layer. The base has a surface and defines a plurality of units, which each includes a notch located in the surface. The first material layer is disposed on the surface of the base and the notches. The insulating layer is disposed on a part of the first material layer and exposing the other part of the first material layer located on the notches. The second material layer is disposed on the other part of the first material layer located on the notches, the second material layer being formed with a plurality of caps, whereby the caps are physically connected to the MEMS devices, and the MEMS devices are corresponding to the units of the base, wherein there is a first connecting force between the first and second material layers, there is a second connecting force between the caps and the MEMS devices, and the second connecting force is greater than the first connecting force.

After the MEMS device is packaged, it is only necessary that the caps are formed again by a second material layer, and then the wafer lever fixture of the present invention can be repeatedly used. Compared with prior art, the wafer lever fixture of the present invention can be repeatedly used so as not to waste the material cost of the base, the photoresist, the first material layer and the insulating layer. Furthermore, steps of the method for packaging MEMS devices by using the wafer lever fixture of the present invention are simple.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1A:
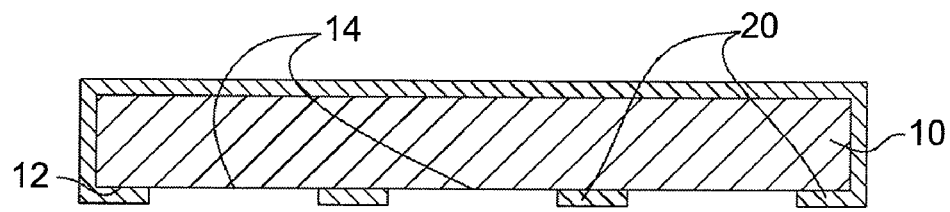
FIGS. 1a to 1g are cross-sectional views showing a method for packaging MEMS devices in the prior art.
Figure 1B:
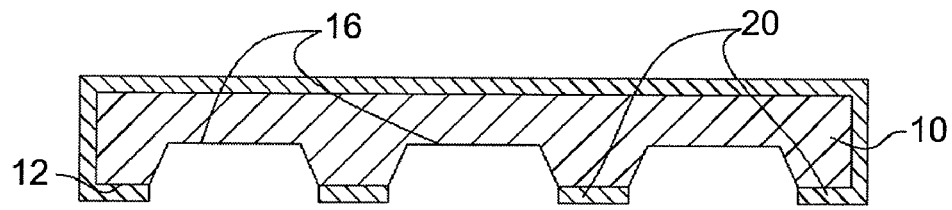
Figure 1C:
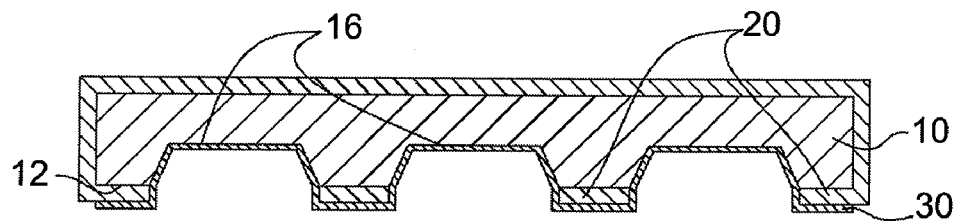
Figure 1D:
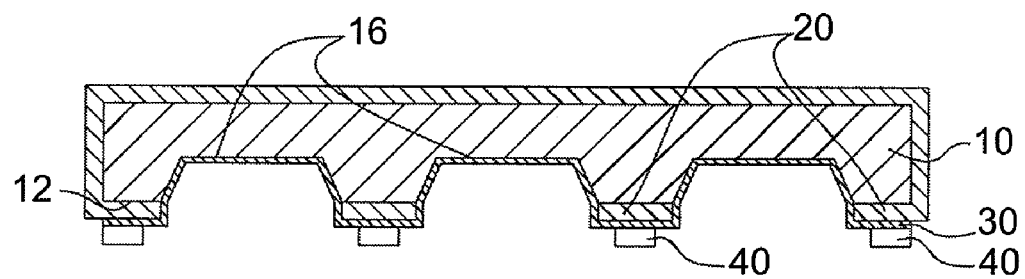
Figure 1E:
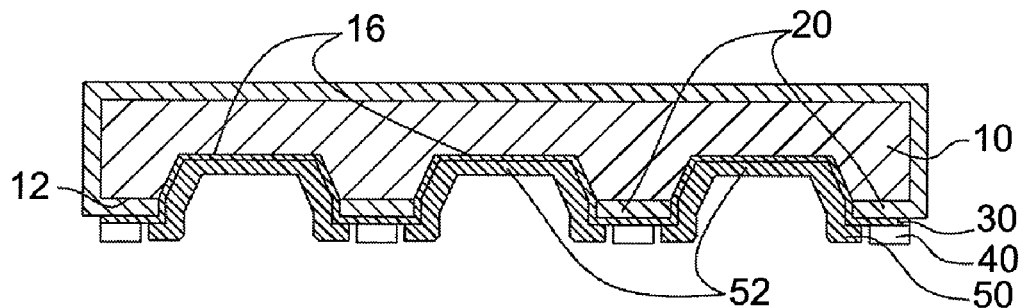
Figure 1F:
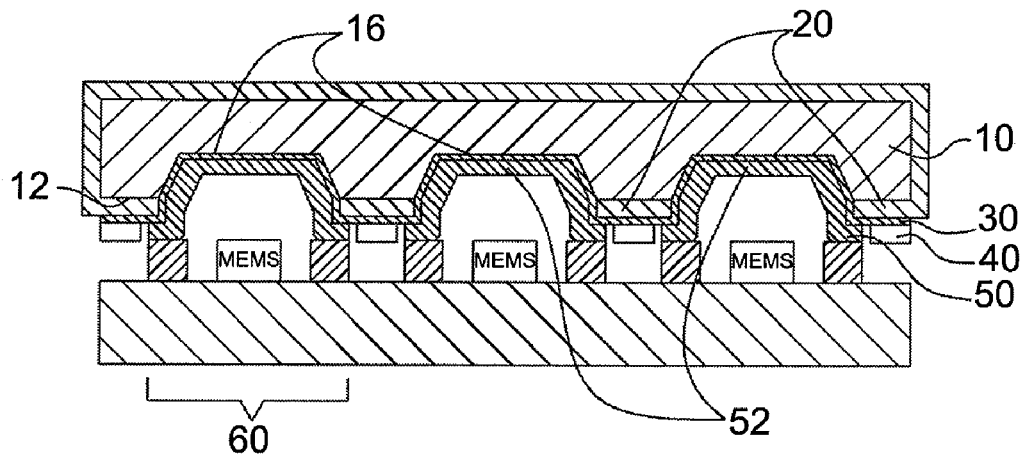
Figure 1G:
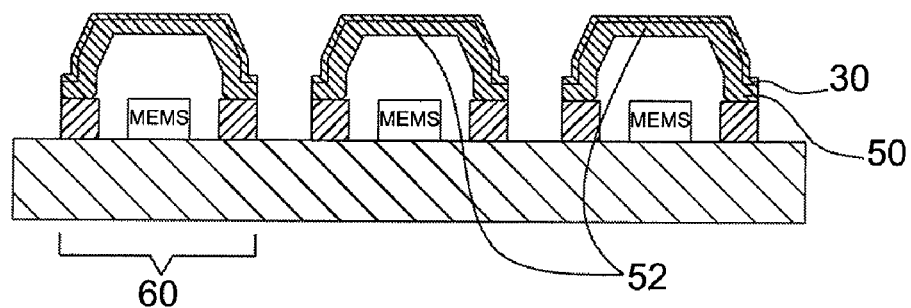
Figure 2:
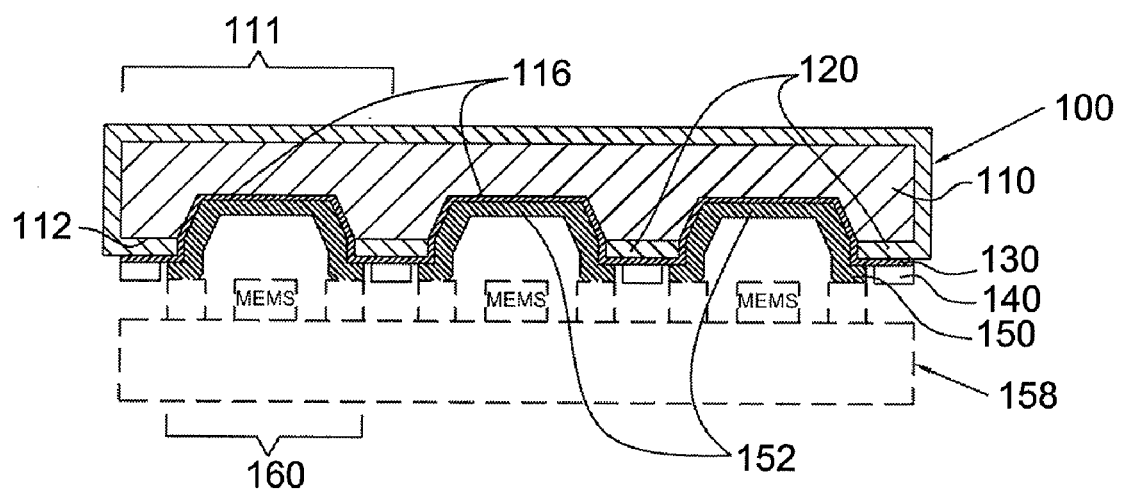
FIG. 2 is a cross-sectional view of a wafer level fixture for packaging MEMS devices according to an embodiment of the present invention.

Referring to FIG. 2, it depicts a wafer level fixture 100 for packaging micro-electro-mechanical-system (MEMS)

devices according to an embodiment of the present invention. In this embodiment, the fixture 100 is used for packaging a plurality of micro-electro-mechanical-system (MEMS) devices 160 of a wafer 158. The fixture 100 includes a base 110, a photoresist layer 120, a first material layer 130, an insulating layer 140 and a second material layer 150. The base 110 has a surface 112 and defines a plurality of units 111, which each includes a notch 116 located in the surface 112. The photoresist layer 120 covers a part of the base 110 and exposes the notches 116. In this embodiment, the photoresist layer 120 can be a passivating layer. The first material layer 130 is disposed on a part of the photoresist layer 120 located on the surface 112 of the base 110 and the notches 116. The first material layer 130 can be a first metallic layer. Preferably, the first metallic layer is made of Titanium (Ti). The insulating layer 140 is disposed on a part of the first material layer 130 located on the photoresist 120 and exposes the other part of the first material layer 130 located on the notches 116.

The second material layer 150 is disposed on the other part of the first material layer 130 located on the notches 116, and the second material layer 150 is formed with a plurality of caps 152. Otherwise, the second material layer 150 can be simultaneously extended to the part of the first material layer 130 located on the photoresist layer 120 so as to form preferable caps in shape. The second material layer 150 can be a second metallic layer. Preferably, the second metallic layer is made of Nickel (Ni).

There is a first connecting force between the first and second material layers 130, 150, e.g. the first connecting force can be formed by an electroplating process. The caps 152 formed by the second material layer 150 can be adapted to be physically connected to the MEMS devices 160, whereby the MEMS devices 160 are corresponding to the units 111 of the base 110. There is a second connecting force between the caps 152 and the MEMS devices 160, e.g. the second connecting force can be formed by an adhesive process or a soldering process. Furthermore, in this embodiment, the second connecting force is greater than the first connecting force.

Figure 3:
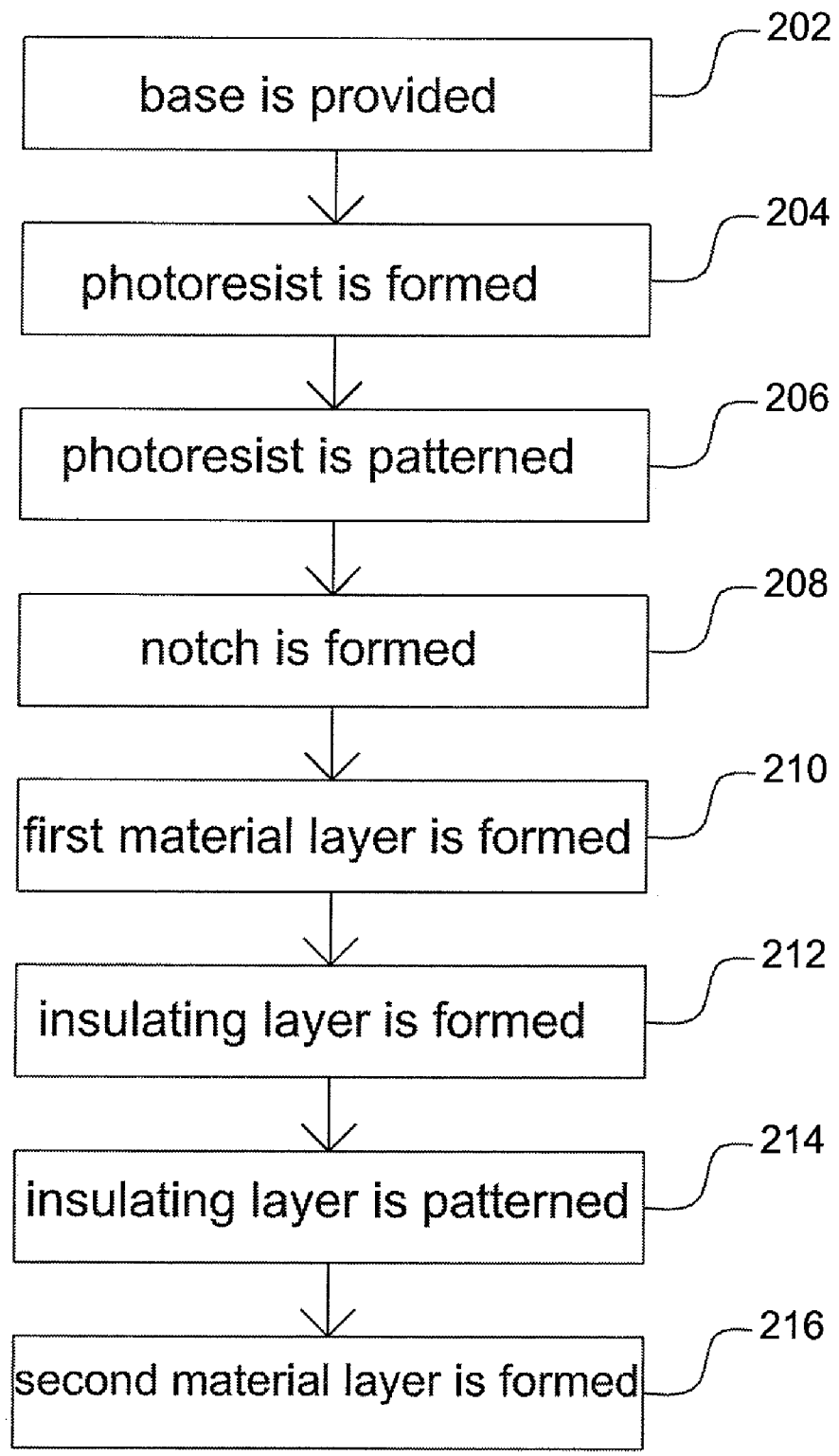
FIG. 3 is a flow diagram showing a method for manufacturing the wafer level fixture for packaging MEMS devices according to the embodiment of the present invention.
Figure 4A:
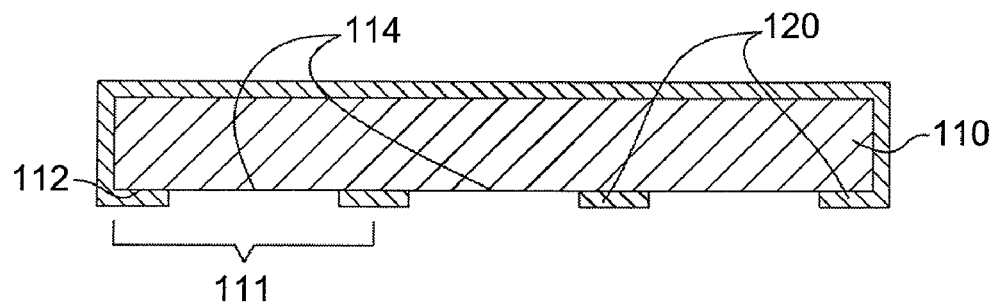
FIGS. 4a to 4c are cross-sectional views showing the method for manufacturing the wafer level fixture for packaging MEMS devices according to the embodiment of the present invention.
Figure 4B:
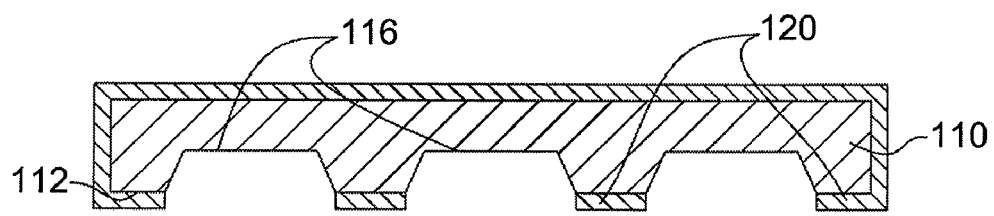

Referring to FIG. 3, it depicts a method for manufacturing the fixture 100 for packaging micro-electro-mechanical-system (MEMS) devices according to the embodiment of the present invention. Referring to FIG. 4a, in the step 202, a base 110 is provided, wherein the base 110 has a surface 112 and defines a plurality of units 111, which each includes a notch region 114 located on the surface 112. In the step 204, a photoresist layer 120 is formed on the base 110. In the step 206, the photoresist layer 120 is patterned for exposing the notch regions 114. In this embodiment, the patterned photoresist layer 120 can be a passivating layer. Referring to FIG. 4b, in the step 208, each notch region 114 on the surface 112 of the base 110 is etched for forming a notch 116.

Figure 4C:
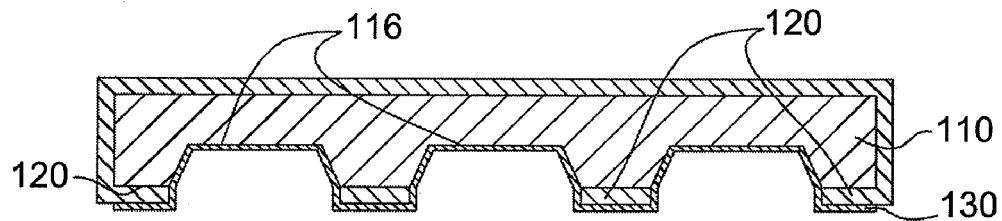

Referring to FIG. 4c, in the step 210, a first material layer 130 is formed on a part of the photoresist layer 120 located on the surface 112 of the base 110 and the notches 116. The first material layer 130 can be a first metallic layer. Preferably, the first metallic layer is made of Titanium (Ti). For example, the first material layer 130 is formed on a part of the photoresist layer 120 located on the surface 112 of the base 110 and the notches 116 by sputtering Titanium (Ti).

Referring to FIG. 4d, in the step 212, an insulating layer 140 is formed on the first material layer 130. In the step 214, the insulating layer 140 is patterned for exposing a part of the first material layer 130 located on the notches 116.

Referring to FIG. 4e, in the step 216, a second material layer 150 is formed on the part of the first material layer 130 located on the notches 116, and the second material layer 150 is formed with a plurality of caps 152. Otherwise, the second material layer 150 can be simultaneously extended to the other part of the first material layer 130 located on the photoresist layer 120 so as to form preferable caps in shape. The second material layer 150 can be a second metallic layer. Preferably, the second metallic layer is made of Nickel (Ni).

There is a first connecting force between the first and second material layers 130, 150. For example, Ni metallic layer is electroplated on Ti metallic layer, i.e. the first connecting force between the first and second material layers 130, 150 can be formed by an electroplating process.

Referring to FIG. 2 again, the caps 152 formed by the second material layer 150 can be adapted to be physically connected to the MEMS devices 160, whereby each MEMS device 160 is corresponding to each unit 111 of the base 110. There is a second connecting force between the caps 152 and the MEMS devices 160. For example, the caps 152 are adhered on the MEMS devices 160, i.e. the second connecting force between the caps 152 and the MEMS devices 160 can be formed by an adhesive process. Otherwise, the caps 152 are soldered on the MEMS devices 160 by solder (not shown), i.e. the second connecting force between the caps 152 and the MEMS devices 160 can be formed by a soldering process. Furthermore, in this embodiment, the second connecting force between the caps 152 and the MEMS devices 160 is greater than the first connecting force between the first and second material layers 130, 150.

Figure 5:
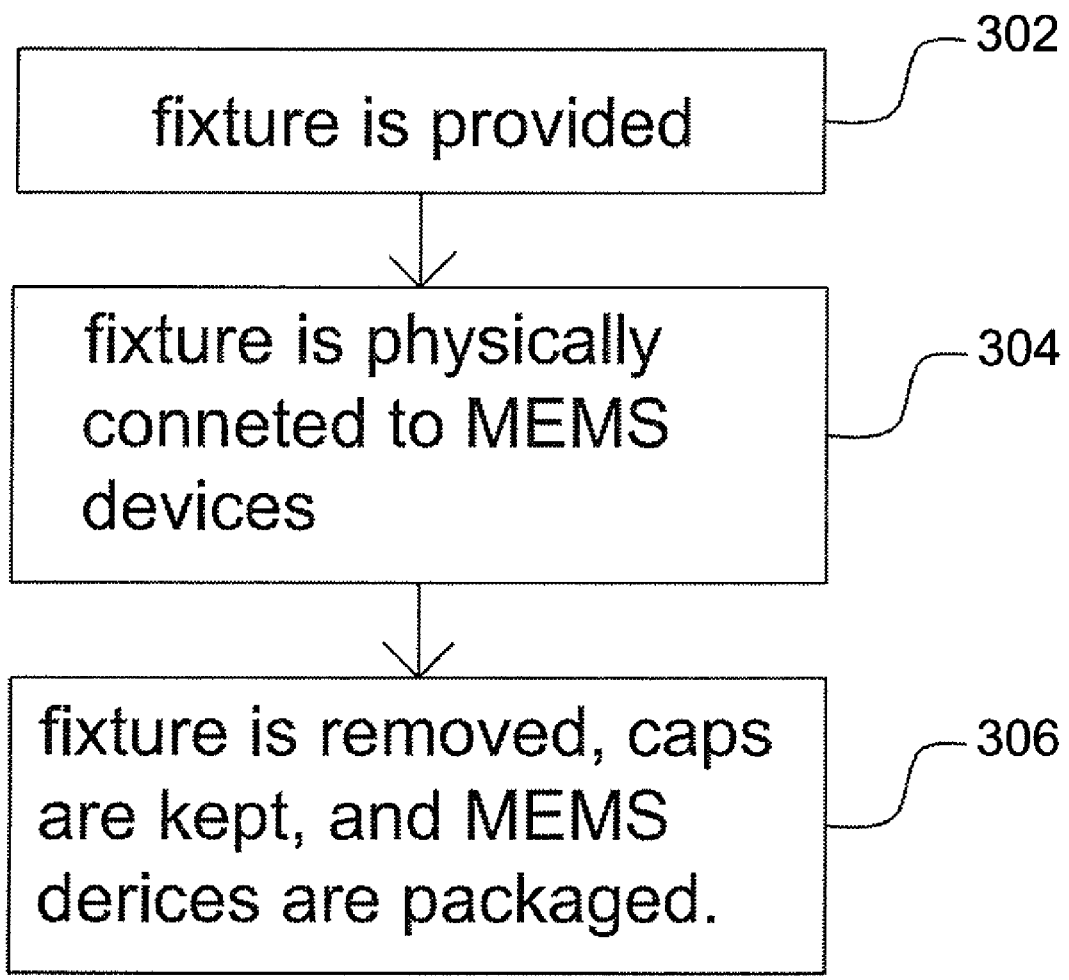
FIG. 5 is a flow diagram showing a method for MEMS devices according to the embodiment of the present invention.

Referring to FIG. 5, it depicts a method for packaging micro-electro-mechanical-system (MEMS) devices according to the embodiment of the present invention. In the step 302, the fixture 100 (shown in FIG. 4e) of the present invention is provided, wherein the fixture 100 includes a base 110, a first material layer 130 and a second material layer 150, the first material layer 130 and the second material layer 150 are disposed on the base 110 in sequence, the second material layer 150 is formed with a plurality of caps 152, and there is a first connecting force between the first and second material layers 130, 150. For example, the first material layer 130 can be a first metallic layer. Preferably, the first metallic layer is made of Titanium (Ti). The second material layer 150 can be a second metallic layer. Preferably, the second metallic layer is made of Nickel (Ni). If Ni metallic layer is electroplated on Ti metallic layer, the first connecting force between the first and second material layers 130, 150 can be formed by an electroplating process.

Figure 6A:
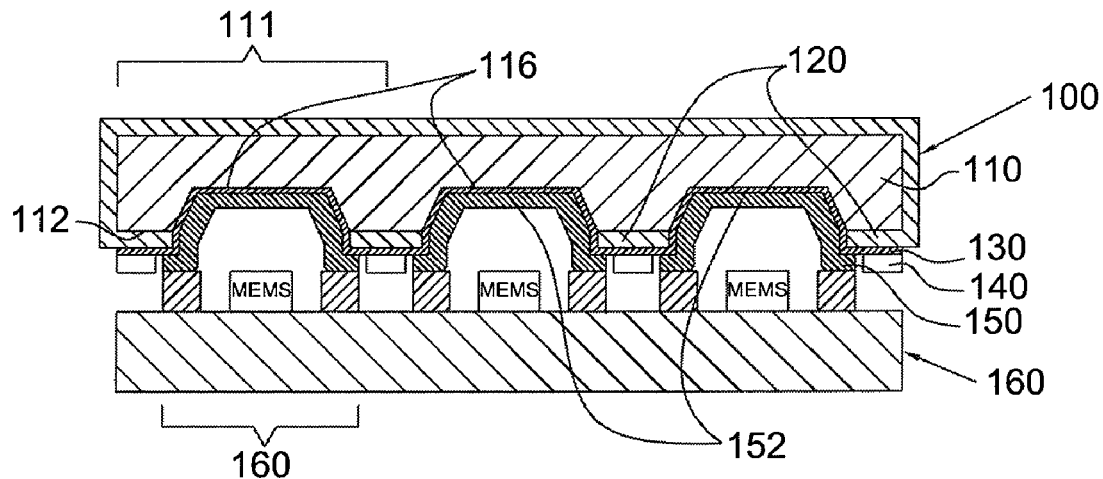
FIGS. 6a to 6b are cross-sectional views showing the method for packaging MEMS devices according to the embodiment of the present invention.

Referring to FIG. 6a, in the step 304, the fixture 100 is physically connected to the MEMS devices 160 of a wafer 158 by the caps 152, whereby each MEMS device 160 is corresponding to each unit 111 of the base 110, wherein there is a second connecting force between the caps 152 and the MEMS devices 160. For example, the caps 152 are adhered on the MEMS devices 160, i.e. the second connecting force between the caps 152 and the MEMS devices 160 can be formed by an adhesive process. Otherwise, the caps 152 are soldered on the MEMS devices 160 by solder (not shown), i.e. the second connecting force between the caps 152 and the MEMS devices 160 can be formed by a soldering process.

Figure 6B:
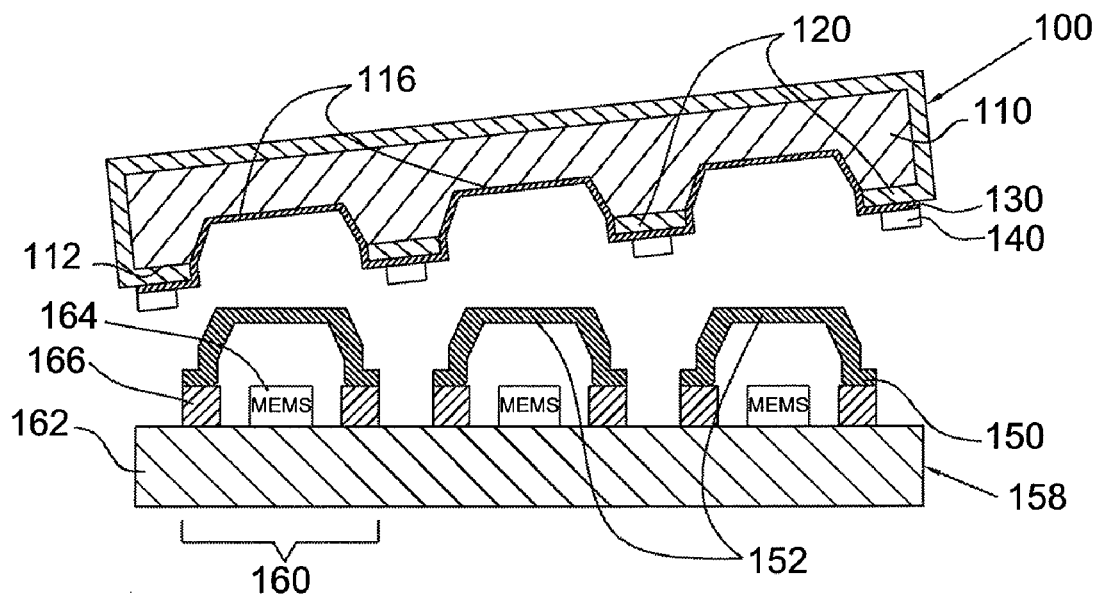

Referring to FIG. 6b, in the step 306, the wafer 158 can be separated from the fixture 100 and the caps 152 can be kept to the MEMS devices 160, because the second connecting force between the caps 152 and the MEMS devices 160 is greater than the first connecting force between the first and second material layers 130, 150. In other words, the caps 152 are kept for packaging the MEMS devices 160 when the fixture 100 is removed.

For example, Referring to FIG. 6b again, if the first and second material layers 130, 150 are respectively made of Ti metallic material and Ni metallic material, the first connecting force between the Ti metallic layer and Ni metallic layer can be formed by an electroplating process. The caps 152 formed by the second material layer 150 are also made of Ni metallic material. The MEMS device 160 includes a substrate 162, a MEMS element 164 and a supporting wall 166. The MEMS element 164 and the supporting wall 166 are disposed on the substrate 162, and the MEMS element 164 is enclosed by the supporting wall 166. The cap 152 is put on the supporting wall 166 of the MEMS device 160. The second connecting force between the caps 152 and the supporting wall 166 can be formed by an adhesive process or a soldering process.

The physical connection between the Ni metallic material and the Ti metallic material wherein the Ti metallic material is electroplated on the Ni metallic material, and thus the physical connection between the caps 152 and the supporting walls 166 is greater than the physical connection between the Ni metallic material and the Ti metallic material, wherein the caps 152 are adhered or soldered on the supporting walls 166. In other words, the second connecting force between the caps 152 and the MEMS devices 160 is greater than the first connecting force between the first and second material layers 130, 150. When the fixture 100 is removed, the caps 152 can be kept to the supporting walls 166 of the MEMS devices 160 for packaging the MEMS devices 160, because the second connecting force between the caps 152 and the MEMS devices 160 is greater than the first connecting force between the first and second material layers 130, 150. Furthermore, the caps 152 are simultaneously separated from each other if the wafer lever fixture 100 includes a plurality of caps 152 when the fixture 100 is removed.

As described above, after the MEMS devices are packaged, it is only necessary that the caps are formed again by a second material layer, and then the wafer lever fixture of the present invention can be repeatedly used. Compared with prior art, the wafer lever fixture of the present invention can be repeatedly used so as not to waste the material cost of the base, the photoresist, the first material layer and the insulating layer. Furthermore, steps of the method for packaging MEMS devices by using the wafer lever fixture of the present invention are simple.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A fixture for packaging micro-electro-mechanical-system (MEMS) devices comprising:
    a base having a surface and defining a plurality of units, which each includes a notch located in the surface;
    a first material layer disposed on the surface of the base and the notches;
    an insulating layer disposed on a part of the first material layer and exposing the other part of the first material layer located on the notches; and
    a second material layer disposed on the other part of the first material layer located on the notches, the second material layer being formed with a plurality of caps, whereby the caps are physically connected to the MEMS devices, and the MEMS devices are corresponding to the units of the base, wherein there is a first connecting force between the first and second material layers, there is a second connecting force between the caps and the MEMS devices, and the second connecting force is greater than the first connecting force.

2. The fixture as claimed in claim 1, further comprising:
    a photoresist layer covering a part of the base and exposing the notches, wherein the first material layer is disposed on a part of the photoresist layer located on the surface of the base and the notches.

3. The fixture as claimed in claim 1, wherein the second material layer is simultaneously extended to the part of the first material layer located on the photoresist layer.

4. The fixture as claimed in claim 1, wherein the first and second material layers are first and second metallic layers respectively.

5. The fixture as claimed in claim 4, wherein the first and second metallic layers are made of Titanium (Ti) and Nickel (Ni) respectively.

6. A method for manufacturing the fixture for packaging micro-electro-mechanical-system (MEMS) devices, the method comprising the following steps of:
    providing a base having a surface and defining a plurality of units, which each includes a notch region located on the surface;
    forming a photoresist layer on the base;
    patterning the photoresist for exposing the notch regions;
    etching each notch region on the surface of the base for forming a notch;
    forming a first material layer on a part of the photoresist layer located on the surface of the base and the notches;
    forming an insulating layer on the first material layer;
    patterning the insulating layer for exposing a part of the first material layer located on the notches; and
    forming a second material layer on the part of the first material layer located on the notches, the second material layer being formed with a plurality of caps, whereby the caps are physically connected to the MEMS devices, and the MEMS devices are corresponding to the units of the base, wherein there is a first connecting force between the first and second material layers, there is a second connecting force between the caps and the MEMS devices, and the second connecting force is greater than the first connecting force.

7. The method as claimed in claim 6, wherein the first and second material layers are first and second metallic layers respectively.

8. The method as claimed in claim 7, wherein the first and second metallic layers are made of Titanium (Ti) and Nickel (Ni) respectively.

9. The method as claimed in claim 7, wherein the first connecting force between the first and second metallic layers is formed by an electroplating process.

10. The method as claimed in claim 6, wherein the second connecting force between the caps and the MEMS devices is formed by an adhesive process.

11. The method as claimed in claim 6, wherein the second connecting force between the caps and the MEMS devices is formed by a soldering process.

12. A method for packaging micro-electro-mechanical-system (MEMS) devices, the method comprising the following steps of:
    providing a fixture including a base, a first material layer and a second material layer, wherein the first material layer and the second material layer are disposed on the base in sequence, the second material layer is formed with a plurality of caps, and there is a first connecting force between the first and second material layers;
    providing a wafer having a plurality of MEMS devices;
    physically connecting the fixture to the MEMS devices of the wafer by the caps, wherein there is a second connecting force between the caps and the MEMS devices, and the second connecting force is greater than the first connecting force; and separating the wafer from the fixture and keeping the caps to the MEMS devices.

13. The method as claimed in claim 12, wherein the first and second material layers are first and second metallic layers respectively.

14. The method as claimed in claim 13, wherein the first and second metallic layers are made of Titanium (Ti) and Nickel (Ni) respectively.

15. The method as claimed in claim 13, wherein the first connecting force between the first and second metallic layers is formed by an electroplating process.

16. The method as claimed in claim 12, wherein the second connecting force between the caps and the MEMS devices is formed by an adhesive process.

17. The method as claimed in claim 12, wherein the second connecting force between the caps and the MEMS devices is formed by a soldering process.

18. A method for packaging micro-electro-mechanical-system (MEMS) devices, the method comprising the following steps of:

providing a base having a surface and defining a plurality of units, which each includes a notch region located on the surface;

forming a photoresist layer on the base;

patterning the photoresist for exposing the notch regions;

etching each notch region on the surface of the base for forming a notch;

forming a first material layer on a part of the photoresist layer located on the surface of the base and the notches;

forming an insulating layer on the first material layer;

patterning the insulating layer for exposing a part of the first material layer located on the notches;

forming a second material layer on the part of the first material layer located on the notches, the second material layer being formed with a plurality of caps, whereby the caps are physically connected to the MEMS devices, and the MEMS devices are corresponding to the units of the base, wherein there is a first connecting force between the first and second material layers, and a fixture is constituted by a base, a first material layer and a second material layer;

providing a wafer having a plurality of MEMS devices;

physically connecting the fixture to the MEMS devices of the wafer by the caps, whereby each MEMS device is corresponding to each unit of the base, wherein there is a second connecting force between the caps and the MEMS devices, and the second connecting force is greater than the first connecting force; and separating the wafer from the fixture and keeping the caps to the MEMS devices.

* * * * *